(12) United States Patent
Shimamura et al.

(10) Patent No.: US 11,286,117 B2
(45) Date of Patent: Mar. 29, 2022

(54) TRANSPORT SYSTEM AND TRANSPORT METHOD

(71) Applicant: Murata Machinery, Ltd., Kyoto (JP)

(72) Inventors: Kazunori Shimamura, Inuyama (JP); Kazumi Harasaki, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 439 days.

(21) Appl. No.: 16/480,787

(22) PCT Filed: Dec. 5, 2017

(86) PCT No.: PCT/JP2017/043608
§ 371 (c)(1),
(2) Date: Jul. 25, 2019

(87) PCT Pub. No.: WO2018/146926
PCT Pub. Date: Aug. 16, 2018

(65) Prior Publication Data
US 2020/0156880 A1    May 21, 2020

(30) Foreign Application Priority Data

Feb. 7, 2017   (JP) .............................. JP2017-020227

(51) Int. Cl.
*B65G 43/10* (2006.01)
*B65G 17/12* (2006.01)
*H01L 21/677* (2006.01)

(52) U.S. Cl.
CPC ............ *B65G 43/10* (2013.01); *B65G 17/12* (2013.01); *H01L 21/67706* (2013.01); *H01L 21/67724* (2013.01); *H01L 21/67727* (2013.01)

(58) Field of Classification Search
CPC ......... B60L 15/38; B65G 43/10; B65G 17/12; B65G 17/123; H01L 21/67706; H01L 21/67724; H01L 21/67727
See application file for complete search history.

(56) References Cited

U.S. PATENT DOCUMENTS

| 2007/0027615 A1 | 2/2007 | Nagasawa |
| 2008/0056864 A1 | 3/2008 | Wada et al. |

(Continued)

FOREIGN PATENT DOCUMENTS

| JP | 2005-170544 A | 6/2005 |
| JP | 2006-219297 A | 8/2006 |

(Continued)

*Primary Examiner* — Seahvosh Nikmanesh
(74) *Attorney, Agent, or Firm* — DLA Piper LLP (US)

(57) ABSTRACT

A deviation amount is a difference between a first error that occurs when an article is placed on a first transfer destination by a first transport vehicle and a second error that occurs when the article is placed on a second transfer destination by the first transport vehicle. An nth error that occurs when the article is placed on an nth transfer destination other than the first transfer destination and the second transfer destination is acquired. In an mth transport vehicle other than the first transport vehicle, a stop position of an mth traveling body is corrected by the nth error and an mth-1 error occurring when the article is placed on the first reference platform, or by the nth error and an mth-2 error as well as the deviation amount, the mth-2 error occurring when the article is placed on the second reference platform.

5 Claims, 11 Drawing Sheets

(56) References Cited

U.S. PATENT DOCUMENTS

| | | |
|---|---|---|
| 2009/0035104 A1 | 2/2009 | Onishi et al. |
| 2009/0238664 A1* | 9/2009 | Murata ............. H01L 21/67769 |
| | | 414/222.02 |
| 2017/0005019 A1* | 1/2017 | Wilby .................... G01G 23/00 |
| 2017/0200626 A1* | 7/2017 | Takai ................ H01L 21/67733 |

FOREIGN PATENT DOCUMENTS

| | | |
|---|---|---|
| JP | 2007-41687 A | 2/2007 |
| JP | 2007-323478 A | 12/2007 |
| JP | 2008-56450 A | 3/2008 |
| JP | 2009-35403 A | 2/2009 |

* cited by examiner

FIG. 6

| Transport vehicle | First reference platform MST1 | Second reference platform MST2 | (X, Y, Z) (mm) |
|---|---|---|---|
| First transport vehicle V1 | (+2, +3, 0) | (+3, +2, −2) | |
| Second transport vehicle V2 | (+3, +4, +1) | (+4, +3, −1) | |
| Third transport vehicle V3 | (−1, +5, +2) | (0, +4, 0) | |
| Fourth transport vehicle V4 | (−3, −5, −6) | (−2, −4, −8) | |
| Fifth transport vehicle V5 | (−4, +4, +1) | (−3, +3, −1) | |
| Sixth transport vehicle V6 | (−6, +5, −1) | (−5, +4, −3) | |
| Seventh transport vehicle V7 | (+2, −1, +8) | (+3, −2, +6) | |
| ⋮ | ⋮ | ⋮ | |
| mth transport vehicle Vm | | | |

Deviation amount calculation
Deviation amount: MST1−MST2
(−1, +1, +2)

TRANSPORT SYSTEM AND TRANSPORT METHOD

TECHNICAL FIELD

This disclosure relates to a transport system and a transport method.

BACKGROUND

In a semiconductor manufacturing factory, for example, to improve space efficiency within a facility, a transport system is used in which articles are transported and the articles are transferred to transfer destinations by transport vehicles that travel along a track installed in the vicinity of the ceiling. The transport vehicle includes a traveling body that travels on the track and a transferer that receives or delivers an article from or to a transfer destination, and the traveling body is stopped to correspond to each transfer destination to receive or deliver the article from or to the transfer destination by the transferer. While teaching of transfer destination can also be performed by having each transport vehicle actually transfer the article to each transfer destination for a plurality of the transport vehicles to accurately transfer the article to each transfer destination, a significant amount of work and effort is required for the teaching operation if the number of transport vehicles or the number of transfer destinations increases. Therefore, in this type of transport system, a transfer position at each transfer destination is preliminarily determined by a reference transport vehicle, and another transport vehicle places an article at one of the transfer destinations and finds an error between the transfer position thereof and the preliminarily determined transfer position. Then, by correcting the transfer position at each transfer destination using the error as an error for the reference transport vehicle, the amount of work and effort is reduced in the operation of the transfer destination teaching for the plurality of transport vehicles (for example, see Japanese Unexamined Patent Application, First Publication No. 2009-035403).

In the transport system mentioned above, when teaching of each transfer destination is performed, one transfer destination is used to correct each transfer destination in each transport vehicle. However, in such a method, when the number of transport vehicles increases as the size of the facility significantly increases, for example, there is a problem that the operation of teaching each transport vehicle becomes time consuming and a large amount of time is required before operating the transport system. Division of transport routes of the transport vehicles into several areas and installation of a reference platform at each area may be considered. However, when a transport vehicle moves to another area, there is a need to perform teaching at the reference platform of that area again, and this may result in reduced operation efficiency in the transport system. The transport system mentioned above may be configured in a manner such that if a stop indicator is mounted at each transfer destination and the transport vehicle detects the stop indicator to stop the traveling body, the article can be transferred to the predetermined position on the transfer destination. However, even in such a situation, transport vehicles other than the transport vehicle serving as the reference still require the teaching operation with use of a single transfer destination to correct the transfer position at each transfer destination, and a larger amount of time will be required as the number of transport vehicles increases as mentioned above.

In view of the above circumstances, it could be helpful to provide a transport system and a transport method capable of reducing the amount of time required for teaching transport vehicles even when the number of the transport vehicles increases.

SUMMARY

We thus provide:

A transport system comprises: a track installed across multiple transfer destinations; a plurality of transport vehicles each including a traveling body that travels on the track, and a transferer that is provided in the traveling body, that holds an article, and that receives or delivers the article from or to the transfer destination; a stop indicator that is mounted at each transfer destination to enable transfer of an article to be performed by the transferer at a predetermined position on the transfer destination, and that indicates a stop position of the traveling body; and a controller that controls the transport vehicles, the transferer receiving or delivering an article from or to the transfer destination in a state where the traveling body is stopped on the basis of the stop indicator, wherein the controller finds a deviation amount, which is a difference between a first error and a second error, on the basis of the first error and the second error, the first error being an error that occurs, when a first traveling body of a first transport vehicle stops on the basis of a first stop indicator at a first transfer destination, between a position at which an article is placed on the first transfer destination by a first transferer and a predetermined position on the first transfer destination, and the second error being an error that occurs, when the first traveling body of the first transport vehicle, which is used for finding the first error, stops on the basis of a second stop indicator at a second transfer destination, between a position at which the article is placed on the second transfer destination by the first transferer and a predetermined position on the second transfer destination, wherein the controller acquires, for at least one transfer destination other than the first transfer destination and the second transfer destination, an nth error that occurs when the first traveling body of the first transport vehicle stops on the basis of an nth stop indicator at an nth transfer destination (where n is an integer and n≥3), between a position at which the article is placed on the nth transfer destination by the first transferer and a predetermined position on the nth transfer destination, and wherein, regarding an mth transport vehicle (where m is an integer and m≥2) other than the first transport vehicle, the controller corrects a stop position of an mth traveling body with respect to the nth transfer destination by the nth error and an mth-1 error, using the mth-1 error that occurs when the mth traveling body of the mth transport vehicle stops on the basis of the first stop indicator at the first transfer destination, between a position at which the article is placed on the first transfer destination by an mth transferer and a predetermined position on the first transfer destination, or the controller corrects the stop position of the mth traveling body with respect to the nth transfer destination by the nth error and an mth-2 error as well as the deviation amount, using the mth-2 error that occurs when the mth traveling body of the mth transport vehicle stops on the basis of the second stop indicator at the second transfer destination, between a position at which the article is placed on the second transfer destination by the mth transferer and a predetermined position on the second transfer destination.

The first error and the second error may be determined as coordinate values in one coordinate system, and the deviation amount may be determined as a coordinate value in the coordinate system. The controller may statistically process a plurality of the deviation amounts found by using a plurality of the transport vehicles and may use the obtained value as the deviation amount.

A transport method is a transport method in a transport system that includes: a track installed across multiple transfer destinations; a plurality of transport vehicles each including a traveling body that travels on the track, and a transferer that is provided in the traveling body, that holds an article, and that receives or delivers the article from or to the transfer destination; and a stop indicator that is mounted at each transfer destination to enable transfer of an article to be performed by the transferer at a predetermined position on the transfer destination, and that indicates a stop position of the traveling body, the transferer receiving or delivering an article from or to the transfer destination in a state where the traveling body is stopped on the basis of the stop indicator, the transport method comprising: stopping a first traveling body of a first transport vehicle on the basis of a first stop indicator at a first transfer destination, and finding a first error that occurs between a position at which an article is placed on the first transfer destination by a first transferer and a predetermined position on the first transfer destination; stopping the first traveling body of the first transport vehicle, which is used for finding the first error, on the basis of a second stop indicator at a second transfer destination, and finding a second error that occurs between a position at which the article is placed on the second transfer destination by the first transferer and a predetermined position on the second transfer destination; finding a deviation amount, which is a difference between the first error and the second error; stopping the first traveling body of the first transport vehicle on the basis of an nth stop indicator at an nth transfer destination (where n is an integer and n≥3), and finding an nth error between a position at which the article is placed on the nth transfer destination by the first transferer and a predetermined position on the nth transfer destination, for at least one transfer destination other than the first transfer destination and the second transfer destination; and regarding an mth transport vehicle (where m is an integer and m≥2) other than the first transport vehicle, stopping an mth traveling body of the mth transport vehicle on the basis of the first stop indicator at the first transfer destination, finding an mth-1 error that occurs between a position at which the article is placed on the first transfer destination by an mth transferer and a predetermined position on the first transfer destination, and correcting a stop position of the mth traveling body with respect to the nth transferer by the nth error and the mth-1 error, or stopping the mth traveling body of the mth transport vehicle on the basis of the second stop indicator at the second transfer destination, finding an mth-2 error that occurs between a position at which the article is placed on the second transfer destination by the mth transferer and a predetermined position on the second transfer destination, and correcting the stop position of the mth traveling body with respect to the nth transfer destination by the nth error and the mth-2 error as well as the deviation amount.

According to a transport system and a transport method, a deviation amount, which is a difference between a first error and a second error detected by a first transport vehicle at a first transfer destination and a second transfer destination, and an nth error at an nth transfer destination are found, and, regarding an mth transport vehicle other than the first transport vehicle, an mth error at the first transfer destination or the second transfer destination is detected, whereby a stop position of a traveling body is corrected using the nth error and the mth error, or both thereof as well as the deviation amount and, therefore, the mth transport vehicle can correct the stop position of the traveling body, using a plurality of transfer destinations. Even when a large number of transport vehicles are operated or when additional transport vehicles are introduced to an existing facility, this configuration enables a reduction in the amount of time required for the operation of teaching the transport vehicle, thereby allowing the transport system to operate promptly.

When coordinate values in one coordinate system are used as deviation amounts, management of the deviation amounts becomes easy, and the respective transport vehicles can easily use the deviation amounts. The controller can increase the accuracy of deviation amounts when a plurality of the deviation amounts found by a plurality of the transport vehicles are statistically processed and the obtained values are used as the deviation amounts.

BRIEF DESCRIPTION OF THE DRAWINGS

FIG. 6 is a diagram showing an example of error information of transport vehicles stored in a data storage of the host controller.

DESCRIPTION OF REFERENCE SIGNS

2: Article
100: Transport system
CU: Host controller (controller)
12CU: Deviation amount calculator
13CU: Deviation amount distributor
C1 to Cm: Trolley controller (controller)
22C1: Deviation amount receiver
24C1: Corrector
26C1: Reference platform determiner
MST1: First reference platform (first transfer destination LP1)
MST2: Second reference platform (second transfer destination LP2)
LP3 to LPn: Third to nth transfer destination
T Track
V1 to V3: Reference transport vehicle (first to third transport vehicles)
V4 to Vm: Fourth to mth transport vehicle
M: Traveling body
U: Transferer

DETAILED DESCRIPTION

Figure 2:
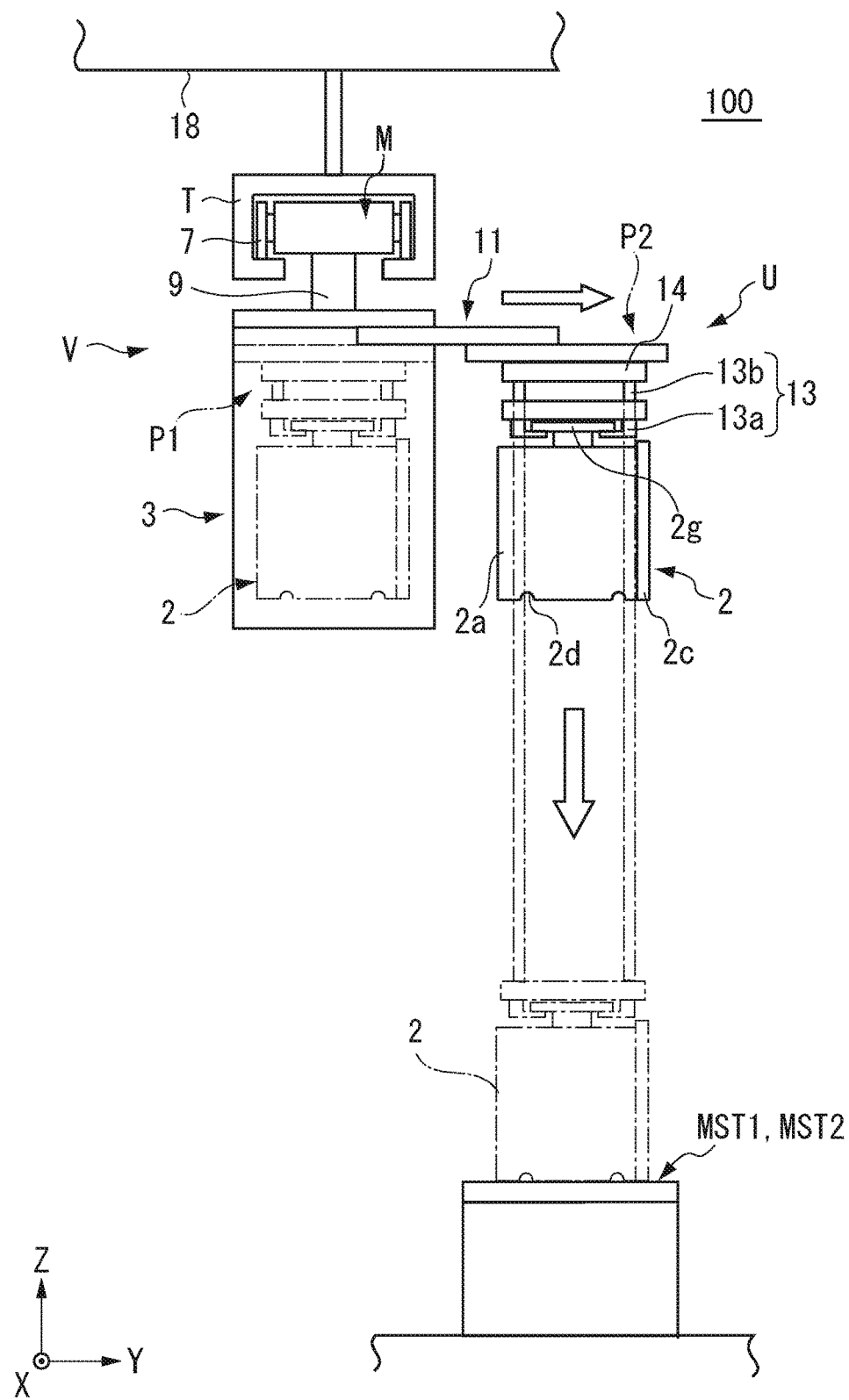
FIG. 2 is a diagram showing an example of a transport vehicle.

Hereinafter, our systems and methods will be described through an example. However, this disclosure as defined in the claims is not limited to the following example, and not all combinations of features described in the example are essential to the means by which we address the above problems. In the drawings, scale is changed as necessary to illustrate the examples such as by enlarging or emphasizing a part. In FIG. 2, an XYZ coordinate system is used to describe directions. In the XYZ coordinate system, a plane parallel to a horizontal plane is defined as an XY plane. A direction perpendicular to the XY plane is denoted as a Z direction. For each of the X direction, the Y direction, and the Z direction, description is made with a definition in which a direction indicated by an arrow is the positive (+) direction and a direction opposite to the direction indicated by the arrow is the negative (−) direction.

Figure 1:
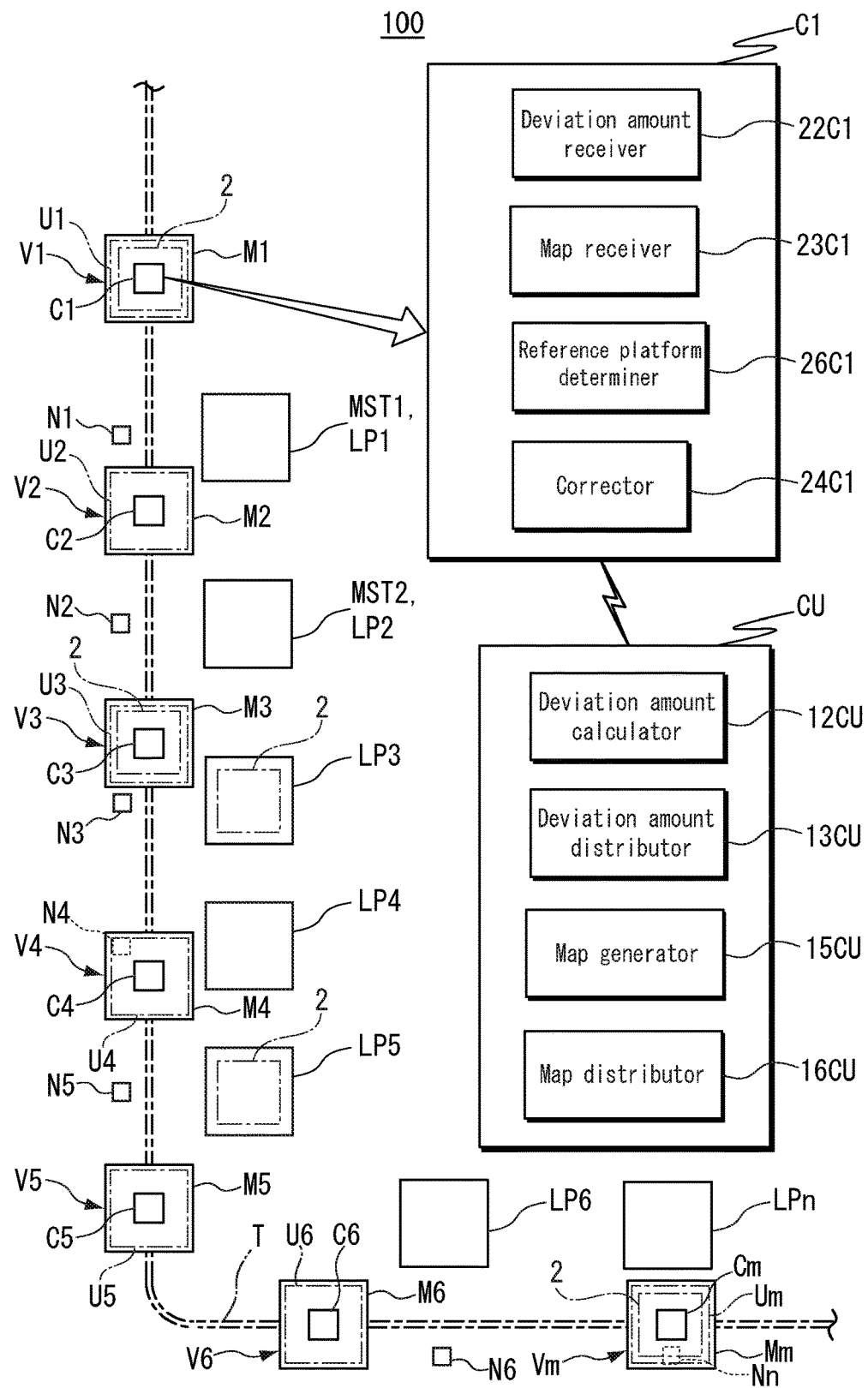
FIG. 1 is a diagram showing an example of a transport system.

FIG. 1 is a diagram showing an example of a transport system 100. The transport system 100 is a system that transports articles 2. Examples of the article 2 here include a FOUP, a SMIF pod, a reticle pod or the like that accommodates objects such as wafers and reticles, the interior of which can be purged with a predetermined type of gas. The transport system 100 includes: first to mth (m is an integer and m≥2) transport vehicles V1 to Vm (hereinafter, may be collectively referred to as transport vehicles V in some examples); a first reference platform MST1 serving as a first transfer destination LP1; a second reference platform MST2 serving as a second transfer destination LP2; nth (n is an integer and n≥3) transfer destinations LP3 to LPn (hereinafter, the first reference platform MST1 and the second reference platform MST2 may be collectively referred to as reference platforms MST in some examples, and the third to the nth transfer destinations LP3 to LPn including the reference platforms MST may be collectively referred to as transfer destinations LP in some examples); and a host controller CU, which is one of controllers of the transport system 100.

The transport vehicles V travel along a track T, and each receive or deliver the article 2 from or to the first reference platform MST1, the second reference platform MST2, or the third to the nth transfer destinations LP3 to LPn arranged below the track T (including the under side and the lateral side thereof). Although the drawings show an example of the first reference platform MST1, the second reference platform MST2, and the third to the nth transfer destinations LP3 to LPn being arranged on the under side and lateral side of the track T, the transfer destinations LP may be on the under side of (directly below) the track T in some examples. The track T is provided in a state of being suspended from a ceiling of a facility such as a clean room by a metal hanger or the like, for example. The transport vehicles V are overhead transport vehicles that travel along the track T. The third to the nth transfer destinations LP3 to LPn are provided, for example, in a part of a processing apparatus, a storage or the like. The number of installations of the third to the nth transfer destinations LP3 to LPn is arbitrary.

The first reference platform MST1 and the second reference platform MST2 are installed to detect an error that occurs when the transport vehicle V places the article 2, between a position at which the article 2 is placed on the first reference platform MST1 and a predetermined position on the first reference platform MST1. The term "error" means a mounting error of a stop indicator N described later and a unique machine difference that each transport vehicle V has. The first reference platform MST1 and the second reference platform MST2 are arranged below the track T (including the under side and the lateral side thereof). The first reference platform MST1 and the second reference platform MST2 may be installed in the vicinity of each other or may be installed at a distance from each other. Although the first reference platform MST1 and the second reference platform MST2 are provided at fixed positions with respect to the floor and so forth on the facility side, they may be provided with a wheel or the like to be movable. The number of the reference platforms MST is not limited to two, and three or more of the reference platforms MST may be installed.

The host controller CU controls the transport vehicles V. The first to the mth transport vehicles V1 to Vm have trolley controllers C1 to Cm (hereinafter, collectively referred to as trolley controllers C in some examples) mounted thereon respectively. The trolley controller C is one of controllers of the transport system 100. The host controller CU communicably connects to the plurality of trolley controllers C via a predetermined communication means. Examples of the predetermined communication means here include communication by a feeder line provided along the track T, and a wireless LAN network.

In the transport system 100, a first error and a second error that occur when the transport vehicle V places the article 2 on the first reference platform MST1 or the second reference platform MST2 (first to nth errors detected by the reference transport vehicle and an error detected by transport vehicle V other than the reference transport vehicle may be collectively referred to as errors in some examples) are detected, using either the first reference platform MST1 or the second reference platform MST2. The first reference platform MST1 and the second reference platform MST2 are not necessarily under the same installation conditions. Therefore, the errors detected by the transport vehicles V take different values when detected using the first reference platform MST1 and when detected using the second reference platform MST2.

The transport system 100: uses one of the plurality of first to mth transport vehicles V1 to Vm as a reference transport vehicle; finds the first error of the reference transport vehicle detected on the first reference platform MST1 (the first transfer destination LP1), and the second error of the reference transport vehicle detected on the second reference platform MST2 (second transfer destination LP2); calculates a deviation amount, which is a difference between the first error and the second error; and corrects, when an error of the transport vehicle V other than the reference transport vehicle is detected on the second reference platform MST2, the stop position (a placement position on the transfer destination LP) of a traveling body M described later, using this error and the deviation amount. In this example, the first transport vehicle V1, the second transport vehicle V2, and the third transport vehicle V3 may serve as reference transport vehicles, and may, in some examples, be referred to as reference transport vehicle V1, reference transport vehicle V2, and reference transport vehicle V3, respectively. The number of reference transport vehicles is arbitrary, and a single reference transport vehicle V1 may be used. In the mth transport vehicle Vm other than the reference transport vehicle V1, the error detected on the first reference platform MST1 is expressed as mth-1 error, and the error detected by the second reference platform MST2 is expressed as the mth-2 error.

As shown in FIG. 1, the host controller CU has a deviation amount calculator 12CU, a deviation amount distributor 13CU, a map generator 15CU, and a map distributor 16CU. The deviation amount calculator 12CU calculates a deviation amount, which is a difference between the first error of the reference transport vehicle V1 or the like detected on the first reference platform MST1, and the second error of the reference transport vehicle V1 or the like detected on the second reference platform MST2. The same one transport vehicle V is used to calculate the amount of deviation. The deviation amount distributor 13CU distributes the deviation amount indicating the deviation amount calculated by the deviation amount calculator 12CU to each of the plurality of transport vehicles V excluding the reference transport vehicle. The map generator 15CU and the map distributor 16CU will be described later.

Taking the trolley controller C1 of the first transport vehicle V1 as an example, the trolley controller C of the transport vehicle V has a deviation amount receiver 22C1, a map receiver 23C1, a reference platform determiner 26C1, and a corrector 24C1. The trolley controllers C2 to Cm of the other second to the mth transport vehicles V2 to Vm also have the same constituents as those of the trolley controller C1.

The deviation amount receiver 22C1 receives the deviation amount distributed by the host controller CU. The reference platform determiner 26C1 determines which of the first reference platform MST1 and the second reference platform MST2 is used when the error was detected. The reference platform determiner 26C1 may be included in the host controller CU instead of being included in the trolley controller C1. In such an example, the host controller CU may manage, for each transport vehicle V, information regarding on which reference platform MST an error is detected, and may provide each transport vehicle V with the information of the reference platform MST, on which the error was detected. When the reference platform determiner 26C1 determines the first reference platform MST1 as having been used, the corrector 24C1 corrects, with the error, the map on which the transfer destinations LP3 to LPn are mapped, and corrects the stop position of the traveling body M with respect to the predetermined transfer destination LP. When the reference platform determiner 26C1 determines the second reference platform MST2 as having been used, the corrector 24C1 corrects the map with a deviation amount indicated by the error and the deviation amount (or corrects the map with a modified error (see FIG. 6) described later), to thereby correct the stop position of the traveling body M with respect to the predetermined transfer destination LP. In addition to correcting the stop position of the traveling body M of each transport vehicle V, the corrector 24C1 may further correct a position of the transfer of the article 2 performed by a transferer U, that is, a lateral extension position of a lateral extender 11 and a lift position of a lift driver 14 described later.

FIG. 2 is a diagram showing an example of the transport vehicle V. In FIG. 2, an example is shown where the article 2 is a FOUP. The article 2 includes a main body 2a, a lid 2c, and a flange 2g. Wafers or the like are accommodated in the interior of the main body 2a. The lid 2c is detachably provided on a side surface of the main body 2a. The main body 2a includes a plurality of grooves 2d radially formed on a bottom surface thereof for positioning.

Each transport vehicle V includes the traveling body M (traveling bodies M1 to Mm of the first to the mth transport vehicles are collectively referred to as traveling body M), and a main body 3. The traveling body M travels along the track T by the driving force of a traveling driver (not shown in the drawings). As the traveling driver, an electric motor such as a stepping motor or a linear motor is used, for example. Traveling wheels 7 of the traveling body M are arranged in contact with the track T and connect to an encoder (not shown in the drawings). The encoder detects the rotation speed and so forth of the traveling wheels 7. The trolley controller C controls the speed and the stop position of the transport vehicle V on the basis of, for example, a pulse number supplied to the stepping motor or a detection result of the encoder mentioned above. The transport vehicle V includes the main body 3 below the traveling body M via a support shaft 9.

The main body 3 has a transferer U (first to mth transferers U1 to Um of the first to the mth transport vehicles are collectively referred to as transferer U) including an article holder 13 that holds the article 2, a lift driver 14 that raises or lowers the article holder 13 along the vertical direction, and a lateral extender 11 that moves the lift driver 14. The article holder 13 grasps the flange 2g of the article 2 to thereby suspend and hold the article 2. The article holder 13 is, for example, a chuck having claws 13a movable in the horizontal direction, and inserts the claws 13a under the flange 2g of the article 2 to thereby suspend and hold the article 2. The article holder 13 connects to suspenders 13b such as wires and belts. The lift driver 14 is, for example, a hoist, and lowers the article holder 13 by feeding out the suspenders 13b and lifts the article holder 13 by taking up the suspenders 13b.

The lateral extender 11 moves the lift driver 14 in the Y direction between a projecting position P2 and a storing position P1. The lateral extender 11 has a plurality of movable plates. The movable plates are moved in the Y direction by a driver not shown in the drawings, and move the lift driver 14 between the projecting position P2 and the storing position P1. The projecting position P2 is a position at which the lift driver 14 projects from the main body 3 toward the lateral side of the track T. The storing position P1 is a position at which the lift driver 14 is stored in the interior of the main body 3. The transferer U including the lateral extender 11, the article holder 13, and the lift driver 14 is controlled by the trolley controller C. The main body 3 including the transferer U moves along the track T in the X direction integrally with the traveling body M.

When transferring the article 2 to the transfer destination LP, the article 2 can be transferred to the reference platform MST or the transfer destination LP by projecting the lift driver 14 to the projecting position P2 by the lateral extender 11 of the transport vehicle V and lowering the article holder 13. When the transfer destination LP is arranged below (directly below) the track T, the article 2 can be transferred to the transfer destination LP by lowering the article holder 13 without projecting the lift driver 14 toward the lateral side of the track T. Although FIG. 2 only shows the first reference platform MST1 or the second reference platform MST2 as the transfer destination of the article 2, the same applies to the other third to the nth transfer destinations LP3 to LPn. The third to the nth transfer destinations LP3 to LPn each have a plurality of (for example, three) pins (not shown in the drawings) provided thereon. The respective pins are fitted into the grooves 2d of the article 2 to thereby position the article 2 on the third to the nth transfer destinations LP3 to LPn.

Figure 3:
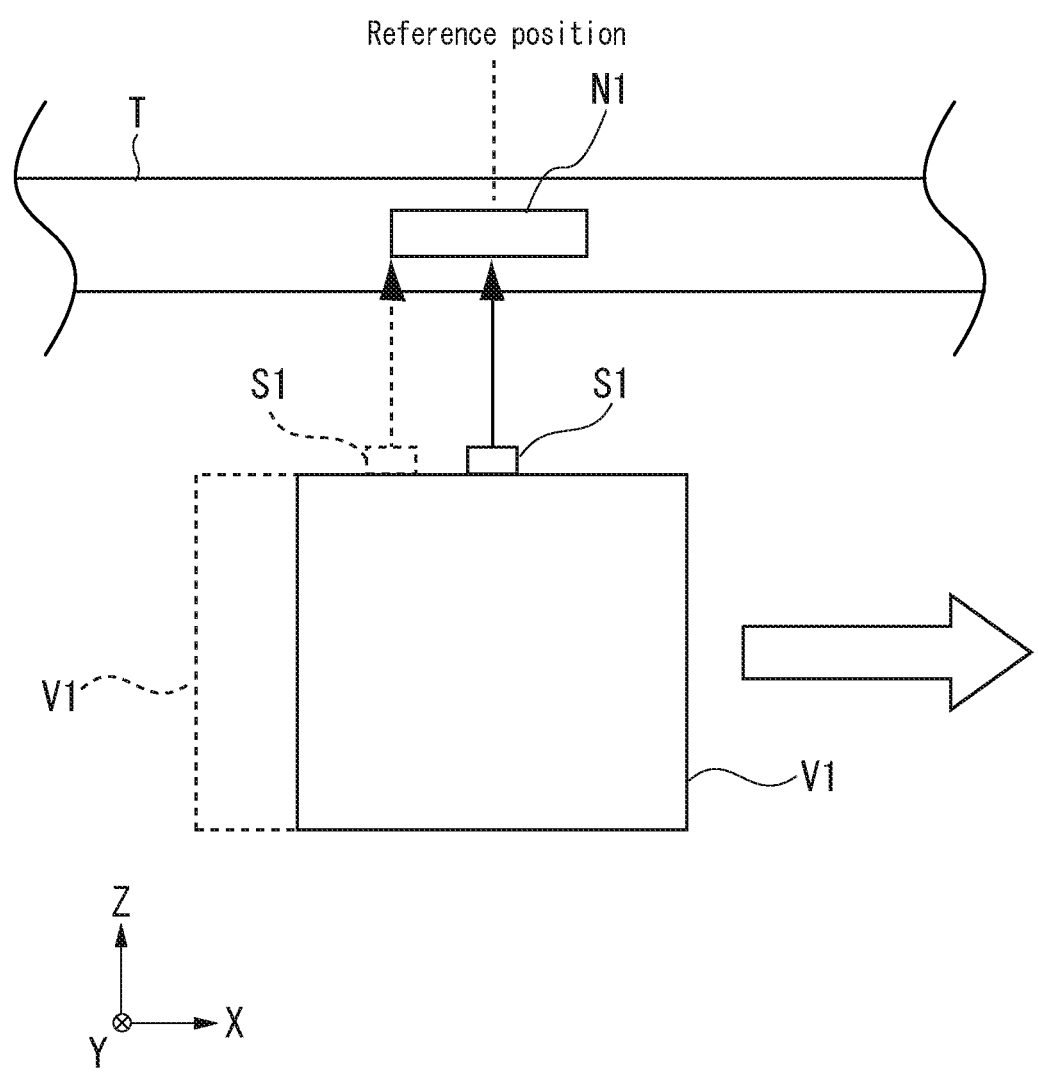
FIG. 3 is a diagram showing an example of a stop indicator.

As shown in FIG. 1, the traveling body M stops at the position corresponding to each transfer destination LP on the basis of stop indicators N1 to Nn arranged along the track T. The stop indicators N1 to Nn (the stop indicators N1 to Nn may be collectively referred to as stop indicator N in some examples) are mounted on the track T or in the vicinity of the track T to enable receiving or delivery of the article 2 to be performed by the transferer U of each transport vehicle V at the predetermined position on the first to nth transfer destinations LP1 to LPn. FIG. 3 is a diagram showing an example of the stop indicator N1. Although FIG. 3 only shows the first stop indicator N1, the same applies to the other stop indicators N2 to Nn. The reference transport vehicle V1 includes a sensor S1 that detects the stop indicators N1 to Nn. Similarly, the other second to the mth transport vehicles V2 to Vm also include sensors S2 to Sm (the sensors S1 to Sm may be collectively referred to as sensor S in some examples) that detect the stop indicators N1 to Nn.

As the sensor S, a non-contact type sensor such as an optical sensor or a magnetic sensor may be used, or a contact type sensor may be used. Since the stop indicator N has a length in the X directions (the directions along the track T), it needs to be set with either one of the X directions serving as a reference. A reference setting method described below is merely an example, and the method is not limited to this example. First, when the first traveling body M1 is traveling by the stepping motor, the stop position can be set on the basis of the pulse number supplied to the stepping motor. Therefore, as shown in FIG. 3, the end of the first stop indicator N1 may be detected by the sensor S1 while the first traveling body M1 is traveling and, from the position at which the end is detected, the position at which the first traveling body M1 is stopped by supplying the preliminarily set pulse number to the stepping motor may be set as a reference position. Each transport vehicle V is set to stop at the reference position mentioned above with respect to each of the stop indicators N1 to Nn. When the transfer destination PL is instructed from the host controller CU, each transport vehicle V travels along the track T and stops at the reference position of the stop indicator N corresponding to the instructed transfer destination LP.

The transport system 100 of this example is set so that when the traveling body M stops with respect to the stop indicator N, the trolley controller C of each transport vehicle V drives the transferer U to deliver the article 2 to the transfer destination LP. However, in the transport system 100, whether or not to opt for such setting is arbitrary. At each transfer destination LP, the lateral extension position (or lateral extension amount) by the lateral extender 11 of the transferer U and the lift position (or lift amount) by the lift driver 14 are preliminarily set for each transfer destination LP in a map described later.

Figure 4:
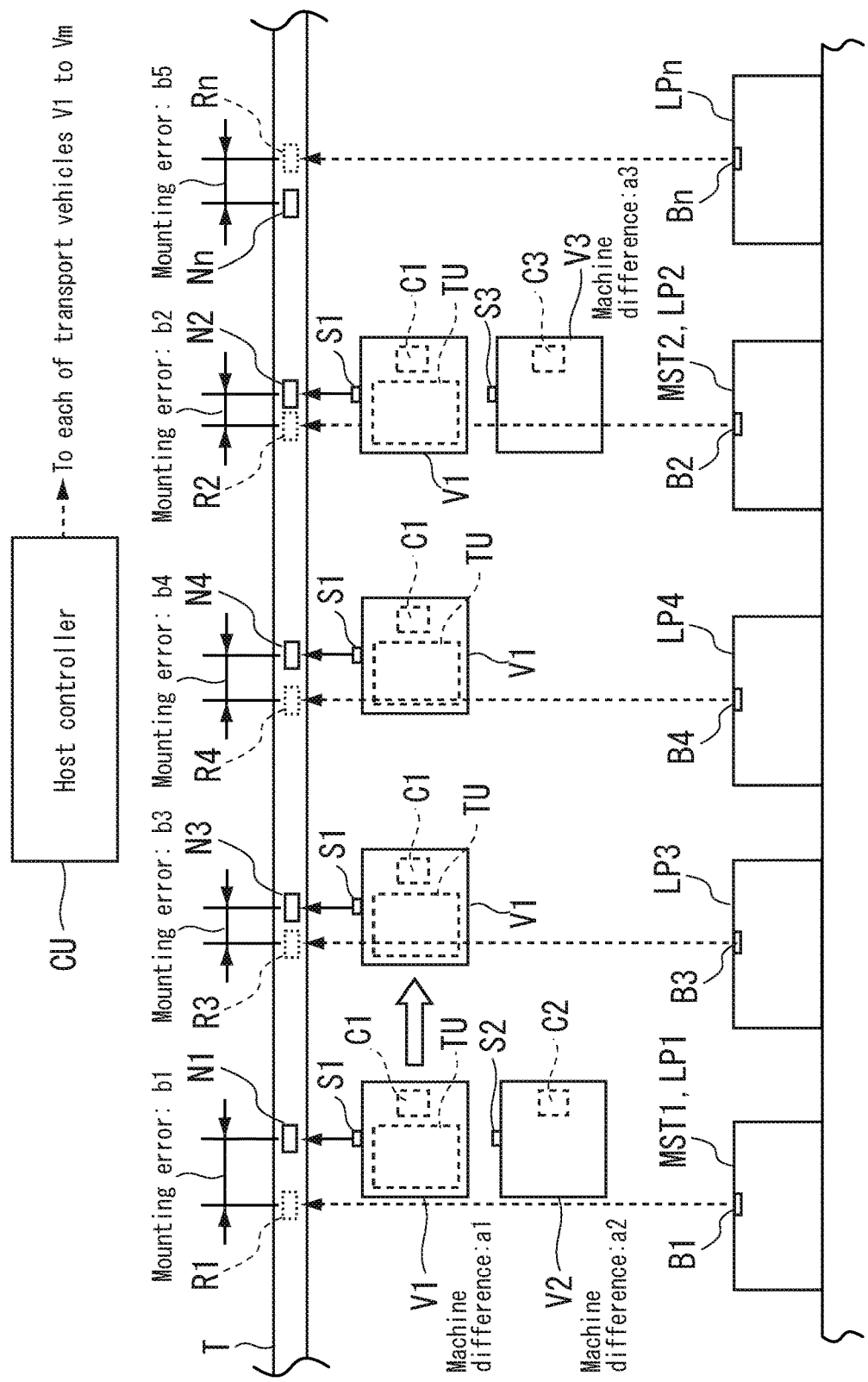
FIG. 4 is a diagram schematically showing a relationship between transfer destinations, stop indicators, and transport vehicles.

The stop indicators N1 to Nn are each mounted to correspond to each transfer destination LP. However, the mounting position thereof may deviate from the position at which it should be mounted in some examples. FIG. 4 is a diagram schematically showing a relationship between the transfer destinations LP, the stop indicators N, and transport vehicles V. As shown in FIG. 4, the stop indicators N1 to Nn are mounted on the track T or in the vicinity of the track T to respectively correspond to the first reference platform MST1 (the first transfer destination LP1), the second reference platform MST2 (the second transfer destination LP2), and the third to the nth transfer destinations LP3 to LPn. For the stop indicators N1 to Nn, indicators R1 to Rn (the indicators R1 to Rn may be collectively referred to as indicator R in some examples) are ideal indicator mounting positions that correspond to references B1 to Bn (the references B1 to Bn may be collectively referred to as reference B in some examples) at the respective transfer destinations L. The reference B is a position serving as a reference when the article 2 is placed at a predetermined position of each transfer destination LP.

It is desirable that the stop indicators N1 to Nn be mounted at the positions of the indicators R1 to Rn without error in the traveling direction of the traveling body M. However, in some examples, they may be mounted being deviated by mounting errors b1 to bn at each of the stop indicators N1 to Nn as shown in FIG. 4. When the stop indicator N is mounted with no deviation from the reference B (when being mounted at the indicator R), the traveling body M stops at this stop indicator N so that the transferer U can receive or deliver the article 2 from or to the predetermined position on the transfer destination LP.

As shown in FIG. 4, the reference transport vehicle V1 uses a teaching unit TU serving as an article to place the teaching unit TU on each transfer destination LP (including the first reference platform MST1 and the second reference platform MST2), and detects an error between the position of the teaching unit TU having been placed and the predetermined position on each transfer destination LP, at each transfer destination LP. Detection of the error may be performed by a sensor mounted on the teaching unit TU, or may be performed by a sensor of a constituent other than the teaching unit TU. First to nth errors of the first to the nth transfer destinations LP1 to LPn detected using the teaching unit TU are sent to the host controller CU as described above. The teaching unit TU may be capable of transmitting the errors to the host controller CU by wireless communication or the like.

As shown in FIG. 4, the reference transport vehicle (the first transport vehicle) V1 causes, for example, the teaching unit TU to detect the first error that occurs when the first traveling body M1 of the reference transport vehicle V1 (refer to FIG. 1) is stopped on the basis of the first stop indicator N1 at the first reference platform MST1 between the position at which the teaching unit TU is placed on the first reference platform MST1 by the first transferer U1 (refer to FIG. 1) and the predetermined position on the first reference platform MST1. The first error is a value obtained by combining a unique machine difference a1 of the reference transport vehicle V1 with the mounting error b1 of the first stop indicator N1 described above. This value is expressed as a coordinate value as described later.

The reference transport vehicle V1 causes, for example, the teaching unit TU to detect the second error that occurs when the first traveling body M1 of the reference transport vehicle V1 is stopped on the basis of the second stop indicator N2 at the second reference platform MST2 between the position at which the teaching unit TU is placed on the second reference platform MST2 by the first transferer U1 and the predetermined position on the second reference platform MST2. The second error is a value obtained by combining a unique machine difference a1 of the reference transport vehicle V1 with the mounting error b2 of the second stop indicator N2 described above. Also, in the reference transport vehicles V2, V3, first error values obtained by combining the unique machine differences a2, a3 of the reference transport vehicles V2, 3 with the mounting error b1 is detected, and the value of the second error obtained by combining the machine difference a2, a3 with the mounting error b2 is detected. The mth transport vehicle Vm other than the reference transport vehicle expresses the error that occurs when the mth traveling body Mm (refer to FIG. 1) is stopped on the basis of the first stop indicator N1 at the first reference platform MST1 between the position at which the teaching unit TU is placed on the first reference platform MST1 by the mth transferer Um (refer to FIG. 1) and the predetermined position on the first reference platform MST1 as the mth-1 error and, similarly, the error with respect to the second reference platform MST2 is expressed as the mth-2 error. The mth-1 error and the mth-2 error also respectively take a value obtained by combining the unique machine difference am of the mth transport vehicle Vm with the mounting error b1 or the mounting error b2 in a manner similar to that described above.

The host controller CU finds a deviation amount, which is a difference between the first error and the second error mentioned above. The deviation amount obtained by the reference transport vehicle V1 is expressed as equation (1).

$$(a1+b1)-(a1+b2)=b1-b2 \quad (1)$$

The machine difference a1 of the reference transport vehicle V1 is now absent, and the deviation amount is found as a difference (for example, a coordinate value) between the mounting error b1 of the first stop indicator N1 and the mounting error b2 of the second stop indicator N2.

For the third to the nth transfer destinations LP3 to LPn other than the first reference platform MST1 and the second reference platform MST2, the reference transport vehicle V1: stops the first traveling body M1 of the reference transport vehicle V1 on the basis of the third to the nth stop indicators N3 to Nn; causes, for example, the teaching unit TU to detect the third to the nth errors between the position at which the teaching unit TU is placed on the third to the nth transfer destinations LP3 to LPn by the first transferer U1, and the predetermined position on the third to the nth transfer destinations LP3 to LPn; and transmits the detection results to the host controller CU. The host controller CU may store the third to the nth errors as a map while associating them with the respective transfer destinations LP. The map is data of the third to the nth errors at the respective transfer destinations LP, and may include the first error and the second error detected by the reference transport vehicle V1.

As shown in FIG. 4, as with the reference transport vehicle V1, the reference transport vehicles V2, V3 may: stop the second and the third traveling bodies M2, M3 of the reference transport vehicles V2, V3 (refer to FIG. 1) on the basis of the first to the nth stop indicators N1 to Nn; place the teaching unit TU on the first reference platform MST1 and the second reference platform MST2 by the second and the third transferers U2, U3 (refer to FIG. 1); and detect the second-1 error, the second-2 error, the third-1 error, and the third-2 error, respectively, in a manner similar to that described above. The host controller CU uses the errors detected by the reference transport vehicles V2, V3 to calculate a deviation amount, which is a difference between the second-1 error and the second-2 error detected by the reference transport vehicle V2, as expressed by equation (2).

$$(a2+b1)-(a2+b2)=b1-b2 \quad (2)$$

The host controller CU also calculates a deviation amount, which is a difference between the third-1 error and the third-2 error detected by the reference transport vehicle V3, as expressed by equation (3).

$$(a3+b1)-(a3-b2)=b1-b2 \quad (3)$$

In either example, the machine difference a2 of the reference transport vehicle V2 and the machine difference a3 of the reference transport vehicle V3 are now absent, and the deviation amounts are found as values (for example, coordinate values) including the difference between the mounting error b1 of the first stop indicator N1 and the mounting error b2 of the second stop indicator N2.

Although not shown in the drawings, regarding the fourth to the mth transport vehicles V4 to Vm other than the reference transport vehicles V2, V3, the mth traveling body Mm of the mth transport vehicle Vm (refer to FIG. 1) is stopped on the basis of the first stop indicator N1 or the second stop indicator N2, and the teaching unit TU is placed on the first reference platform MST1 or the second reference platform MST2 by the mth transferer Um (refer to FIG. 1) to detect the mth-1 error or the mth-2 error. The mth-1 error or the mth-2 error is a value including the machine differences a4 to am of the fourth to the mth transport vehicles V4 to Vm respectively.

Figure 5:
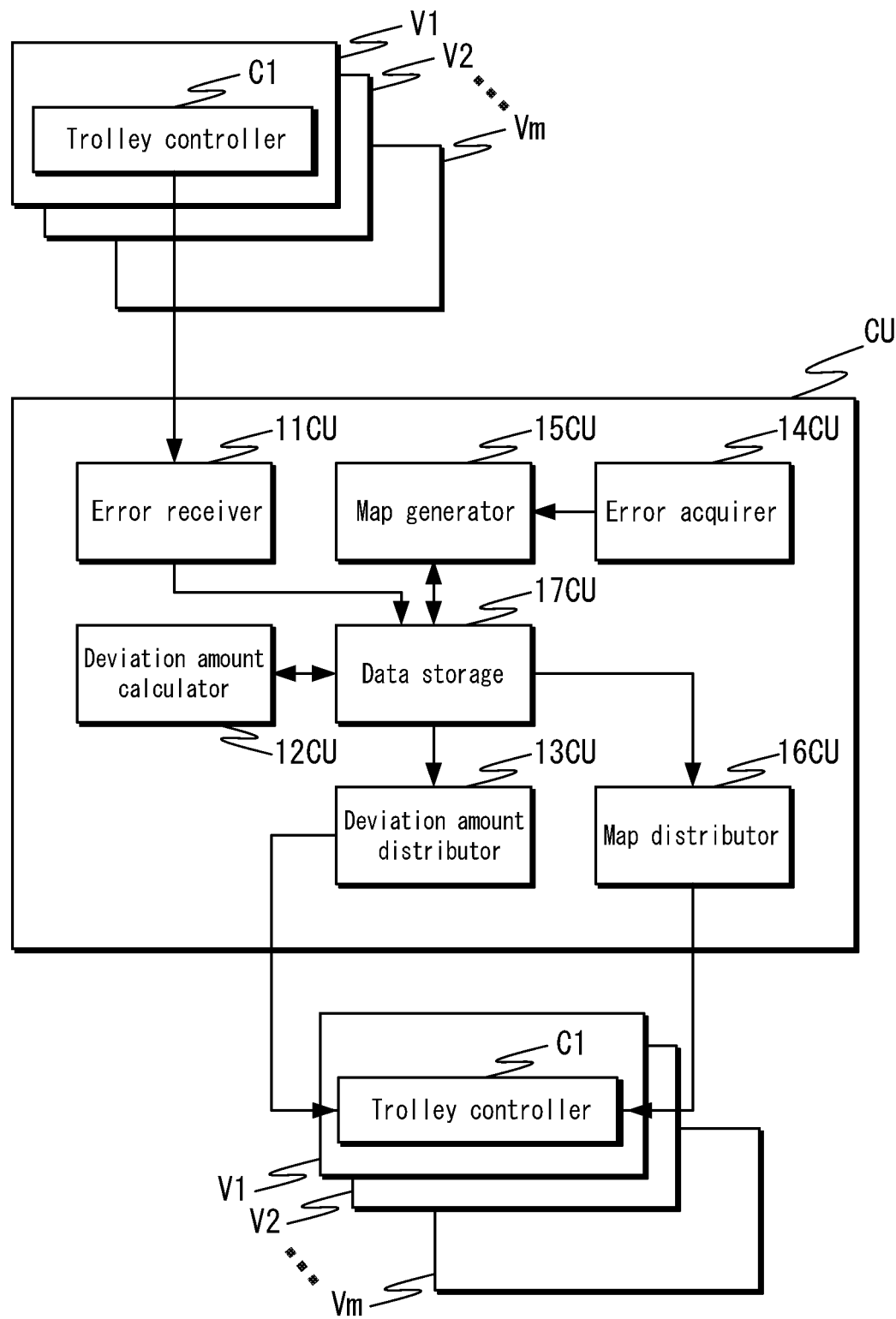
FIG. 5 is a diagram showing an example of a functional block configuration of a host controller.

FIG. 5 is a diagram showing an example of a functional block configuration of the host controller CU. In addition to the deviation amount calculator 12CU and the deviation amount distributor 13CU, the host controller CU has an error receiver 11CU, an error acquirer 14CU, the map generator 15CU, the map distributor 16CU, and a data storage 17CU. The error receiver 11CU receives, from the trolley controllers C1 to C3 of the reference transport vehicles V1 to V3, the first errors (including the second-1 error and the third-1 error) of the reference transport vehicles V1 to V3 detected when the teaching unit TU is placed on the first reference platform MST1. The error receiver 11CU receives, from the trolley controllers C1 to C3 of the reference transport vehicles V1 to V3, the first errors (including the second-1 error and the third-1 error) of the reference transport vehicles V1 to V3 detected when the teaching unit TU is placed on the second reference platform MST2.

The error acquirer 14CU acquires, for example, the third to the nth errors that occur when the reference transport vehicle V1 places the teaching unit TU on the third to the nth transfer destinations LP3 to LPn. The third to the nth errors may be acquired by the error receiver 11CU and, in such an example, the error acquirer 14 CU need not be provided. The map generator 15CU generates, for example, a map consolidating the third to the nth errors that occur when the reference transport vehicle V1 places the teaching unit TU on each of the third to the nth transfer destinations LP3 to LPn. The map distributor 16CU distributes the map to each trolley controller Cm of the mth transport vehicle Vm. Various types of data are stored in a data storage 17CU. For example, the data storage 17CU stores the first error, the second error, the second-1 error, the second-2 error, the third-1 error, the third-2 error, the deviation amount calculated by the deviation amount calculator 12CU, the map generated by the map generator 15CU and so forth.

FIG. 6 shows an example of errors of the transport vehicles V stored in the data storage 17CU in a form of a table. The data storage 17CU stores errors detected by each transport vehicle V at one or both of the first reference platform MST1 and the second reference platform MST2. Information in the column "first reference platform MST1" shown in FIG. 6 is information indicating modified errors in which the first error and the mth-1 error of the transport vehicle V detected on the first reference platform MST1, or the mth-2 error of the transport vehicle V detected on the second reference platform MST2 are modified with the deviation amount. Similarly, information in the column "second reference platform MST2" is information indicating modified errors in which the second error and the mth-2 error of the transport vehicle V detected on the second reference platform MST2, or the mth-1 error of the transport vehicle V detected on the first reference platform MST1 are modified with the deviation amount. In FIG. 6, the modified errors are shown as being surrounded in square boxes. The modified error indicates an error on a reference platform MST different from the reference platform MST on which the error is actually detected, and is a value obtained by subtracting the deviation amount calculated by the deviation amount calculator 12CU from the actually detected error. In this example, the stop position (or the placement position of the article 2) of the traveling body Mm with respect to the transfer destination LP may be corrected using the modified error shown in FIG. 6 in some examples.

The example shown in FIG. 6 stores the first error, the second-1 error, and the third-1 error detected on the first reference platform MST1 and the second error, the second-2 error, and the third-2 error detected on the second error MST2, in the reference transport vehicles V1 to V3. Also, the example shown in FIG. 6 stores the fourth-1 error and the fifth-1 error detected on the first reference platform MST1 and the modified errors that are each modified with the deviation amount on the basis of the fourth-1 error and the fifth-1 error detected on the first reference platform MST1, in the fourth transport vehicle V4 and the fifth transport vehicles V5. Also, the example shown in FIG. 6 stores the sixth-2 error and the seventh-2 error detected on the second reference platform MST2 and the modified errors that are each modified with the deviation amount on the basis of the sixth-2 error and the seventh-2 error detected on the second reference platform MST2, in the sixth transport vehicle V6 and the seventh transport vehicles V7.

In FIG. 6, the errors of the transport vehicles V are expressed by coordinate values such as (error in the X direction, error in the Y direction, error in the Z direction), using the XYZ coordinate system. In FIG. 6, the unit of each coordinate value is, for example, mm. For example, the first error (+2, +3, 0) of the reference transport vehicle V1 indicates that the first error is +2 mm in the X direction, +3 mm in the Y direction, and ±0 mm in the Z direction. The value related to the X direction in the first error is an error related to the stop position of the traveling body M. The value related to the Y direction in the first error is an error related to the lateral extension position of the article 2 by the lateral extender 11. The value related to the Z direction in the first error is an error related to the lift position of the article 2 by the lift driver 14.

Figure 7:
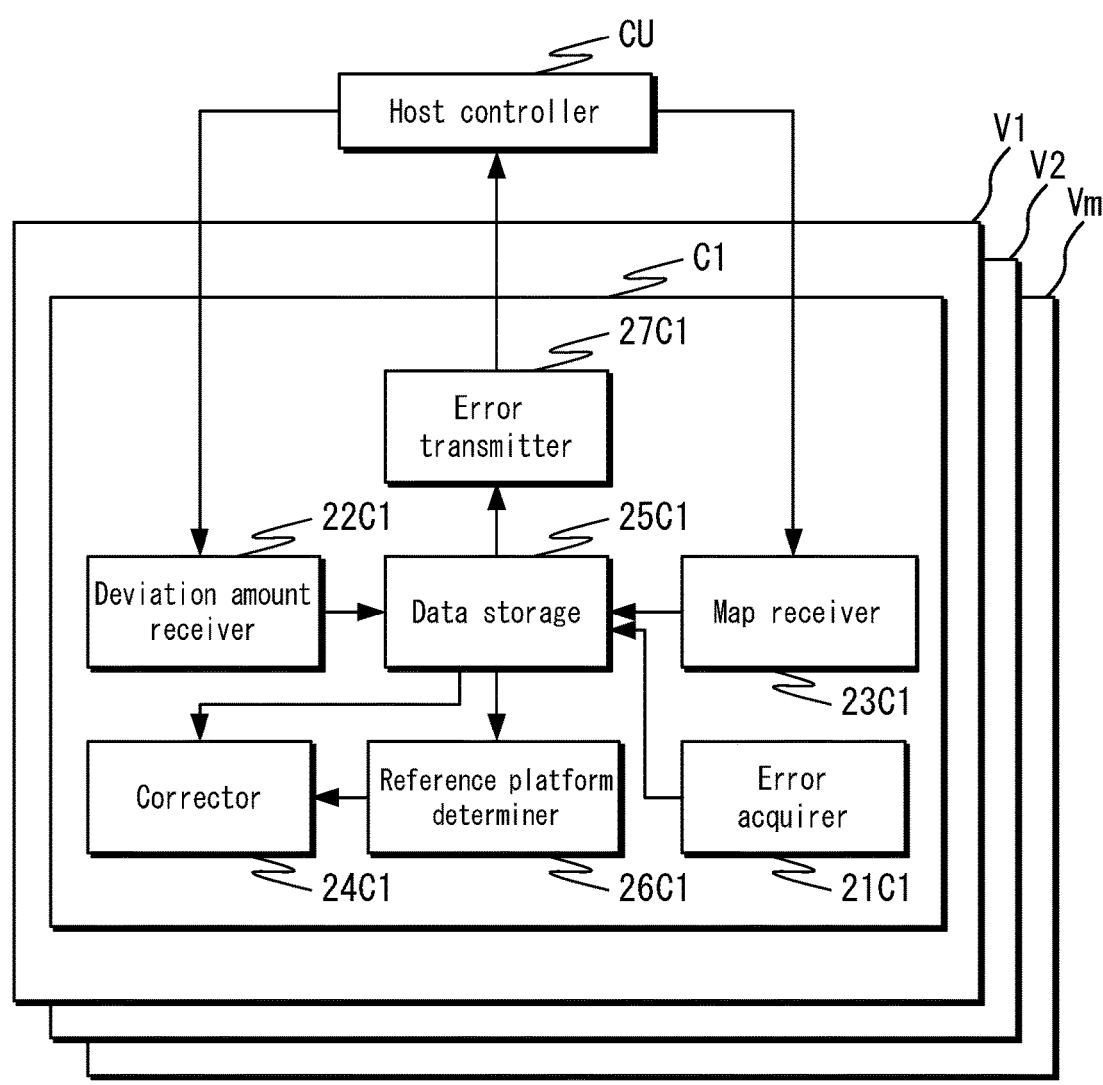
FIG. 7 is a diagram showing an example of a functional block configuration of a trolley controller of the transport vehicle.

FIG. 7 is a diagram showing an example of a functional block configuration of the trolley controller C of the transport vehicle V. In FIG. 7, the trolley controller C1 of the reference transport vehicle V1 will be described as an example. In addition to the deviation amount receiver 22C1, the reference platform determiner 26C1 and the corrector 24C1, the trolley controller C1 has an error acquirer 21C1, a map receiver 23C1, an error transmitter 27C1, and a data storage 25C1. The other trolley controllers C2 to Cm also have the same configuration as that of the trolley controller C1.

The error acquirer 21C1 acquires an error related to one or both of the first error and the second error detected when the teaching unit TU is placed on the reference platform MST. The map receiver 23C1 receives a map distributed by the host controller CU. The error transmitter 27C1 transmits the error acquired by the error acquirer 21C1 to the host controller CU. When the teaching unit TU can transmit the error to the host controller CU, the error acquirer 21C1 and the error transmitter 27C1 may be omitted. Various types of data are stored in a data storage 25C1. For example, the data storage 25C1 stores the deviation amount received by the deviation amount receiver 22C1, the map received by the map receiver 23C1, the error acquired by the error acquirer 21C1 and so forth.

Figure 8:
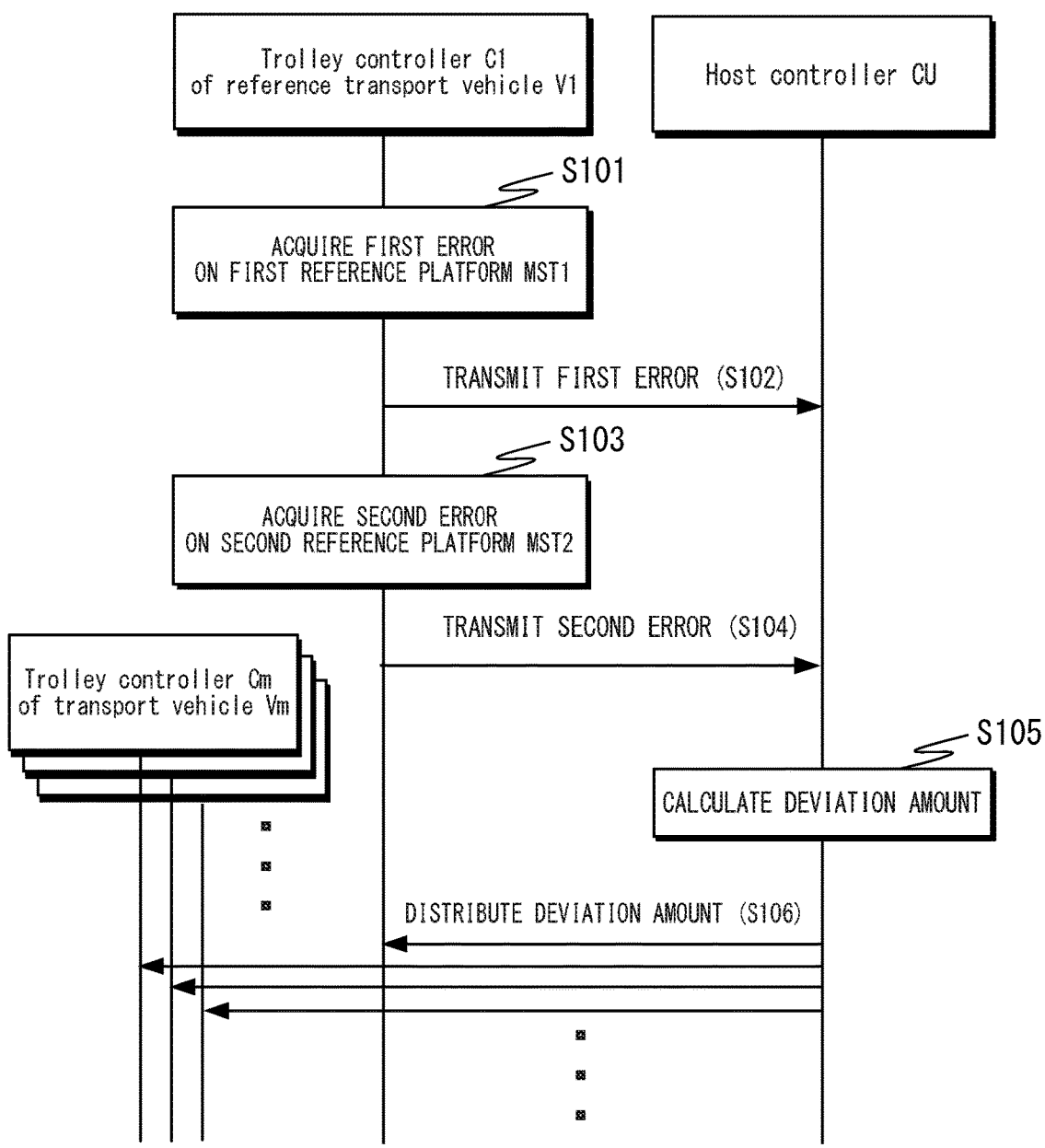
FIG. 8 is a diagram showing an example of an operation sequence of the transport system.

FIG. 8 is a diagram showing an example of a sequence of an operation performed between the trolley controller C1 of the reference transport vehicle V1 and the host controller CU. FIG. 8 refers to the operation flow and describes operation of the host controller CU associated with detection of the first error and the second error performed by the reference transport vehicle V1 using the first reference platform MST1 and the second reference platform MST2. In the description of this operation flow, reference will be made to FIG. 1 to FIG. 7 where appropriate.

First, to detect the first error of the reference transport vehicle V1 on the first reference platform MST1, the first traveling body M1 of the reference transport vehicle V1 is stopped at the first stop indicator N1, and the first transferer U1 is driven to place the teaching unit TU on the first reference platform MST1. Operation of the reference transport vehicle V1 may be performed, for example, manually by an operator, or may be automatically performed by the trolley controller C1 acquiring the position on the first reference platform MST1 from the host controller CU.

When the teaching unit TU is placed on the first reference platform MST1 by the reference transport vehicle V1, the error acquirer 21C1 of the trolley controller C1 (see FIG. 7) or the teaching unit TU (see FIG. 4) detects the first error between the predetermined position on the first reference platform MST1 and the position at which the teaching unit TU is actually placed, to acquire the first error (Step S101). The predetermined position of the first reference platform MST1 may be set, for example, by an indicator provided on the first reference platform MST1, or may be preliminarily acquired as a coordinate value from the host controller CU.

The position on the first reference platform MST1 at which the teaching unit TU is placed may be detected by a sensor provided in the teaching unit TU, or the teaching unit TU may be externally image-captured by a camera or the like and acquired from the captured image. When using an image, an indicator marking is preliminarily provided on the first reference platform MST1, and the first error may be detected from the relative position between the indicator marking and the teaching unit TU. The placement position of the teaching unit TU may be acquired, for example, by using a distance sensor or the like.

In Step S101, the error acquirer 21C1 or the teaching unit TU compares the predetermined position on the first reference platform MST1 to the position at which the teaching unit TU is actually placed, and acquires the first error, which is a difference therebetween.

The error acquirer 21C1 or the teaching unit TU calculates the differences in the X direction, the Y direction, and the Z direction in the XYZ coordinate system for the first error, and acquires it as the first error. For example, when the difference in the placement position of the teaching unit TU with respect to the predetermined position on the first reference platform MST1 is +2 mm in the X direction, +3 mm in the Y direction, and 0 mm in the Z direction, the error acquirer 21C1 acquires the first error (+2, +3, 0). Next, the error acquirer 21C1 stores the acquired first error in the data storage 25C1 (see FIG. 7).

When the first error is stored in the data storage 25C1, the error transmitter 27C1 (see FIG. 7) reads out the first error stored in the data storage 25C1 and transmits it to the host controller CU (Step S102). In Step S102, the teaching unit TU may transmit the first error to the host controller CU. Upon receiving the first error transmitted from the trolley controller C1, the error receiver 11CU (see FIG. 5) of the host controller CU stores the first error in the data storage 17CU (see FIG. 3). For example, as shown in FIG. 6, the data storage 17CU stores the first error (+2, +3, 0) of the reference transport vehicle V1.

Next, to detect the first error of the reference transport vehicle V1 on the second reference platform MST2, the reference transport vehicle V1 places the teaching unit TU on the second reference platform MST2. The reference transport vehicle V1 is the same transport vehicle as the transport vehicle used to find the first error. As with the manner described above, operation of the reference transport vehicle V1 may be performed, for example, manually by an operator, or may be automatically performed by the trolley controller C1 acquiring the position on the second reference platform MST2 from the host controller CU.

When the teaching unit TU is placed on the second reference platform MST2 by the reference transport vehicle V1, the error acquirer 21C1 of the trolley controller C1 or the teaching unit TU acquires the second error between the predetermined position on the second reference platform MST2 and the position at which the teaching unit TU is placed (Step S103), in a manner similar to that of acquiring the first error. The error acquirer 21C1 stores the acquired second error in the data storage 25C1.

When the second error is stored in the data storage 25C1, the error transmitter 27C1 of the trolley controller C1 reads out the second error stored in the data storage 25C1 and transmits it to the host controller CU (Step S104). In Step S104, the teaching unit TU may transmit the second error to the host controller CU. Upon receiving the second error transmitted from the trolley controller C1 of the reference transport vehicle V1, the error receiver 11CU of the host controller CU stores the second error in the data storage 17CU. In this manner, for example, as shown in FIG. 6, the data storage 17CU stores the second error (+3, +2, −2) of the reference transport vehicle V1.

In this example, the first transport vehicle V1, the second transport vehicle V2, and the third transport vehicle V3 are used as reference transport vehicles. Therefore, the second-1 error and the second-2 error of the reference transport vehicle V2 and the third-1 error and the third-2 error of the reference transport vehicle V3 are also acquired as with the reference transport vehicle V1 and are stored in the data storage 17CU of the host controller CU.

When the first error and the second error (including the second-1 error and the second-2 error, and the third-1 error and the third-2 error) are stored in the data storage 17CU, the deviation amount calculator 12CU of the host controller CU (see FIG. 5) calculates a deviation amount, which is a difference between the first error and the second error (Step S105). The deviation amount calculator 12CU calculates differences in the X direction, the Y direction, and the Z direction in the XYZ coordinate system respectively as the difference between two errors, namely the first error and the second error.

For example, as shown in FIG. 6, when the first error is (+2, +3, 0) and the second error is (+3, +2, −2), the deviation amount calculator 12CU finds (+2, +3, 0)−(+3, +2, −2), calculates a deviation amount (coordinate value), that is, (−1, +1, +2), and stores this deviation amount in the data storage 17CU.

In this example, a plurality of the reference transport vehicles V1 to V3 are used. Therefore, the deviation amount calculator 12CU may calculate three deviation amounts respectively from the difference between the first error and the second error, the difference between the second-1 error and the second-2 error, and the difference between the third-1 error and the third-2 error, for each of the reference transport vehicles V1, V2, and V3 and may take any one of the deviation amounts as a representative value, or a value obtained by statistically processing the three deviation amounts may be used. For example, when the deviation amounts are scattered, the deviation amount calculator 12CU may take the average value of the three deviation amounts as the deviation amount, or may take the median value of the three deviation amounts as the deviation amount. The mode value of scattering of the three deviation amounts may be taken as the deviation amount. When the deviation amount is stored in the data storage 17CU, the deviation amount distributor 13CU (see FIG. 5) of the host controller CU reads out the deviation amount stored in the data storage 17CU and transmits it to each of the plurality of transport vehicles V (Step S106). In Step S106, the deviation amount distributor 13CU may, for example, distribute the deviation amount to the transport vehicles V except for the reference transport vehicle V1.

Figure 9:
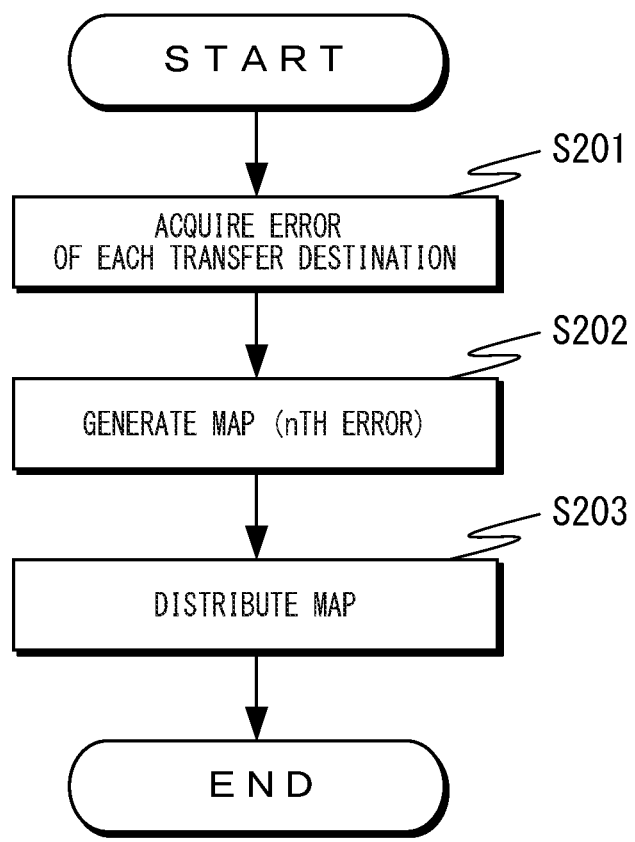
FIG. 9 is a diagram showing an example of an operation flow of the host controller.

FIG. 9 is a diagram showing an example of an operation flow of the host controller CU. Operation of the host controller CU associated with placement of the teaching unit TU on the plurality of transfer destinations LP performed by the reference transport vehicle V1 and so forth will be described with reference to the operation flow shown in FIG. 9. In the description of this operation flow, appropriate reference will be made to FIG. 1 to FIG. 8 where appropriate.

When detection of the first error and so forth of the reference transport vehicle V1 and so forth on the reference platforms MST is completed, the teaching unit TU is placed on each of the third to the nth transfer destinations LP3 to LPn by the reference transport vehicle V1 for example. In this example, the reference transport vehicle V1 is used to place the teaching unit TU on the plurality of transfer destinations LP3 and so forth. However, when there are a plurality of reference transport vehicles V1 to V3 as in this example, any reference transport vehicle may be used. Operation of the reference transport vehicle V1 may be performed, for example, manually by the operator, or may be automatically performed by the trolley controller C acquiring information related to the stop position on the nth transfer destination LPn from the host controller CU.

When the teaching unit TU is placed on the third to the nth transfer destinations LP3 to LPn by the reference transport vehicle V1, the error acquirer 14CU or the error receiver 11CU (see FIG. 5) of the host controller CU acquires the nth errors (the third to the nth error) that occur when the reference transport vehicle V1 places the teaching unit TU on the third to the nth transfer destinations LP3 to LPn (Step S201). The error acquirer 14CU or the error receiver 11CU acquires, for example, the third to the nth errors, which are differences between the predetermined positions on the third to the nth transfer destinations LP3 to LPn and the position at which the teaching unit TU is actually placed. The nth error data may be indicated as values in the X direction, Y direction, and Z direction in the XYZ coordinate system at the third to the nth transfer destinations LP3 to LPn. The positions respectively predetermined at the third to the nth transfer destinations LP3 to LPn are preliminarily set for each transfer destination.

For example, when the position at which the teaching unit TU is actually placed is deviated by 4 (mm) in the X direction, 6 (mm) in the Y direction, and 1 (mm) in the Z direction with respect to the predetermined position at the nth transfer destination LPn, the error acquirer 14CU or error receiver 11CU acquires coordinate values (+4, +6, +1) as the nth error of the nth transfer destination LPn. The error acquirer 14CU or the error receiver 11CU may acquire such an error, for example, by receiving a transmission from the teaching unit TU, or by operating an operation terminal or a keyboard that manually operates the reference transport vehicle V1. The error may be acquired from results of detection performed by various types of sensors provided in the reference transport vehicle V1 or the nth transfer destination LPn. The error acquirer 14CU or the error receiver 11CU stores the acquired error in the data storage 17CU.

When the nth error is stored in the data storage 17CU, the map generator 15CU (see FIG. 5) of the host controller CU generates a map that maps the third to the nth errors at the third to the nth transfer destinations LP3 to LPn detected by the reference transport vehicle V1 (Step S202).

The map generator 15CU stores the thus generated map in the data storage 17CU. When the map is stored in the data storage 17CU, the map distributor 16CU (see FIG. 5) of the host controller CU reads out the map stored in the data storage 17CU and transmits it to each trolley controller C of the respective transport vehicles V except for the reference transport vehicle V1 (Step S203).

Figure 10:
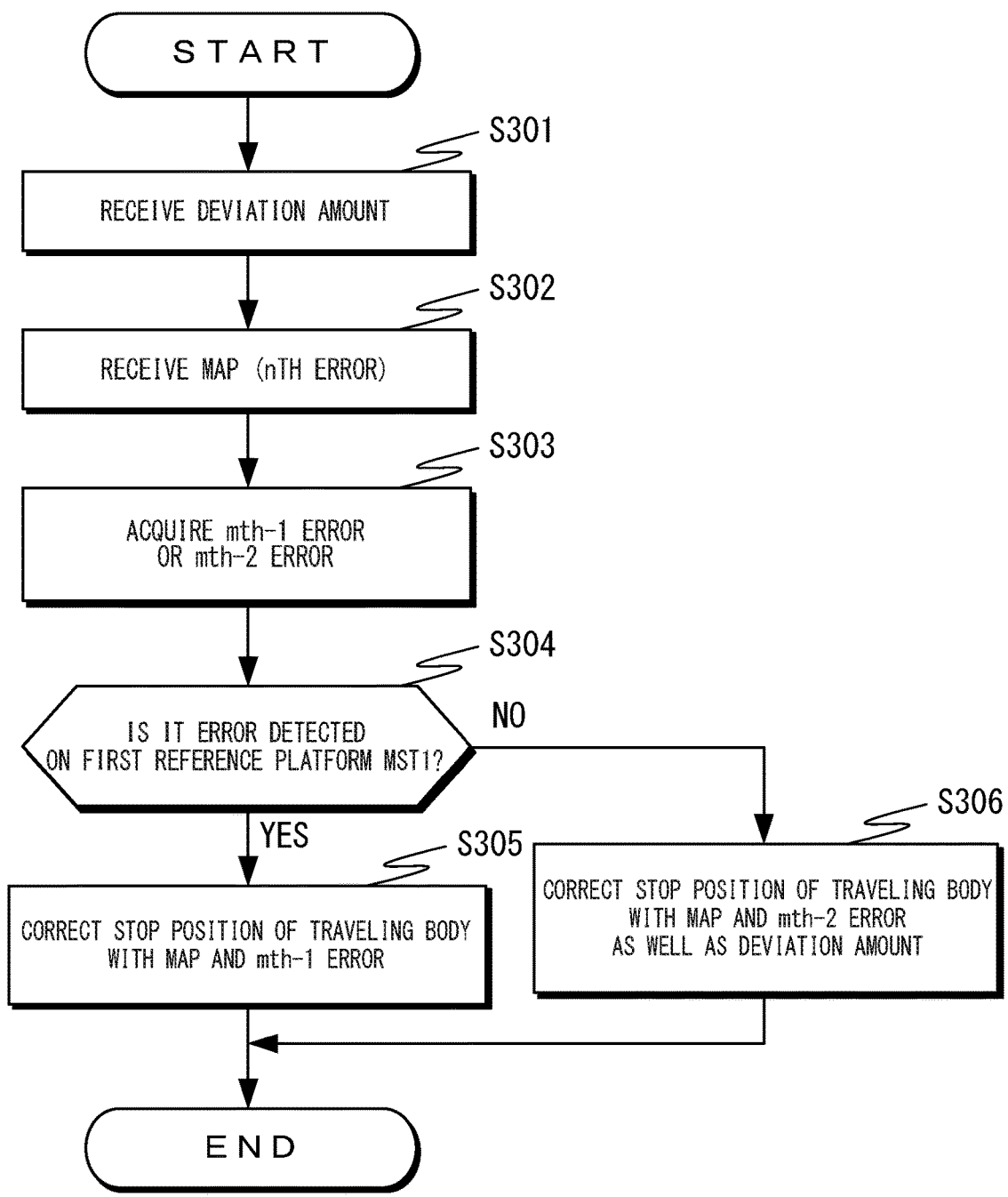
FIG. 10 is a diagram showing an example of an operation flow of the trolley controller of the transport vehicle.

FIG. 10 is a diagram showing an example of an operation flow of the trolley controller C of the transport vehicle V. Operation of the trolley controller C performed when the article 2 is placed on the transfer destination LP by the transport vehicle V will be described with reference to the operation flow shown in FIG. 10. In this operation flow, the fourth to the mth transport vehicles V4 to Vm (see FIG. 1 and FIG. 6) other than the reference transport vehicles V1 to V3 will be described, and reference will be made to FIG. 1 to FIG. 9 where appropriate. Hereinafter, the fourth transport vehicle V4 is taken as an example, however, the same applies to the fifth to the mth transport vehicles V5 to Vm.

A deviation amount receiver 22C4 (see reference sign 22C1 in FIG. 7) of a trolley controller C4 of the fourth transport vehicle V4 receives the deviation amount distributed in Step S106 of FIG. 8 (Step S301). The received deviation amount is stored in a data storage 25C4. A map receiver 23C4 (see reference sign 23C1 in FIG. 7) of the trolley controller C4 of the fourth transport vehicle V4 receives the map distributed in Step S203 of FIG. 9 (Step S302). The received map is stored in the data storage 25C4.

To detect an error of the fourth transport vehicle V4 on the first reference platform MST1 or the second reference platform MST2, the operator manually operates the fourth transport vehicle V4 to place the teaching unit TU on the first reference platform MST1 or the second reference platform MST2 by the fourth transport vehicle V4. When the teaching unit TU is placed on either the first reference platform MST1 or the second reference platform MST2, the error acquirer 21C4 of the trolley controller C4 (see reference sign 21C1 in FIG. 7) or the teaching unit TU acquires the fourth-1 error or the fourth-2 error detected on either the first reference platform MST1 or the second reference platform MST2, as with Step S101 of FIG. 8 (Step S303). In the fifth to the mth transport vehicles V5 to Vm, the errors detected on either the first reference base MST1 or the second reference base MST2 are indicated by the fifth-1 error to the mth-1 error, or the fifth-2 error to the mth-2 error. The error acquirer 21C4 stores the acquired fourth-1 error or the fourth-2 error in the data storage 25C4.

Next, a reference platform determiner 26C4 (see reference sign 26C1 in FIG. 7) of the trolley controller C4 determines which of the first reference platform MST1 and the second reference platform MST2 was used to detect the error (Step S304). For example, as header information of data in the fourth-1 error or the fourth-2 error, identification information of the reference platform MST used to detect the error is written. The reference platform determiner 26C4 may determine which of the first reference platform MST1 and the second reference platform MST2 was used to detect the error by making reference to the header information. The reference platform determiner 26C4 may determine which of the first reference platform MST1 and the second reference platform MST2 was used, from the position at which the fourth traveling body M4 (see FIG. 2) of the fourth transport vehicle V4 was stopped by the first stop indicator N1 or the second stop indicator N2. The reference platform determiner 26C4 sends the determination result to a corrector 24C4 (see reference sign 24C1 in FIG. 7).

If the first reference platform MST1 is used from the determination result of the reference platform determiner 26C4 (Step S304; YES), at each transfer destination LP, the corrector 24C4 corrects the stop position of the fourth traveling body M4 with the map (the nth error) stored in the data storage 25C4 and the fourth-1 error (Step S305). The corrector 24C4 corrects the stop position of the fourth traveling body M4 by subtracting the fourth-1 error from the nth error of the map, for example. By stopping the fourth traveling body M4 at the corrected stop position and driving the fourth transferer U4, the fourth transport vehicle V4 can accurately receive or deliver the article 2 to or from the transfer destination LP. In Step S305, in addition to correcting the stop position of the fourth traveling body M4, the lateral extension position of the lateral extender 11 and the lift position of the lift driver 14 at each transfer destination LP may also be corrected.

If the second reference platform MST2 is used from the determination result of the reference platform determiner 26C4 (Step S305; NO), at each transfer destination LP, the corrector 24C4 corrects the stop position of the fourth traveling body M4 with the map (the nth error) stored in the data storage 25C4 and the fourth-2 error (Step S307) as well as the deviation amount stored in the data storage 25C4 (Step S307). In Step S307, the stop position of the fourth traveling body M4 may be corrected with the map (the nth error) and the modified error in the fourth transport vehicle V4 (see FIG. 6). The corrector 24C4 corrects the stop position of the fourth traveling body M4 by subtracting the fourth-1 error and the deviation amount from the nth error of the map, for example. By stopping the fourth traveling body M4 at the corrected stop position and driving the fourth transferer U4, the article 2 can accurately be received or delivered from or to the transfer destination LP even when the fourth transport vehicle V4 detects the fourth-2 error on the second reference platform MST2.

The fourth to the mth transport vehicles V4 to Vm that are not reference transport vehicles have been described above. However, the reference transport vehicles V2, V3 that did not detect the nth error (map) can accurately receive or deliver the article 2 from or to the transfer destination LP by correcting the stop positions of the second traveling body M2 and the third traveling body M3 with the nth error (map), and the second-1 error and the third-1 error detected at the first reference platform MST1.

As described above, according to this example, even when an error is detected at the second reference platform MST2, the article 2 can accurately be received or delivered from or to each transfer destination LP by correcting the stopping position of the traveling body M with the deviation amount, which is a difference between the first reference platform MST1 and the second reference platform MST2. This configuration enables, even when a large number of transport vehicles V are operated or when additional transport vehicles V are introduced to an existing facility, a reduction in the length of time required for the operation of teaching the transport vehicles V.

The error receiver 11CU, the deviation amount calculator 12CU, the deviation amount distributor 13CU, the error acquirer 14CU, the map generator 15CU, the map distributor 16CU, and the data storage 17CU of the host controller CU described above may be realized as a specific means in which software and hardware cooperate, by reading a program into a computer. Similarly, the error acquirer 21, the deviation amount receiver 22, the map receiver 23, the corrector 24, the data storage 25, the reference platform determiner 26, and the error transmitter 27 of the trolley controller C of the transport vehicle V may be realized as a specific means in which software and hardware cooperate, by reading a program into a computer.

The example of our system and method has been described above. However, the technical scope of this disclosure is not limited to the description of the above example. It is also apparent to those skilled in the art that various modifications or improvements can be added to the above example. The technical scope of this disclosure also encompasses one or more of such modifications or improvements. For example, the host controller CU may be included in the trolley controller C of any one of the transport vehicles V.

Figure 11:
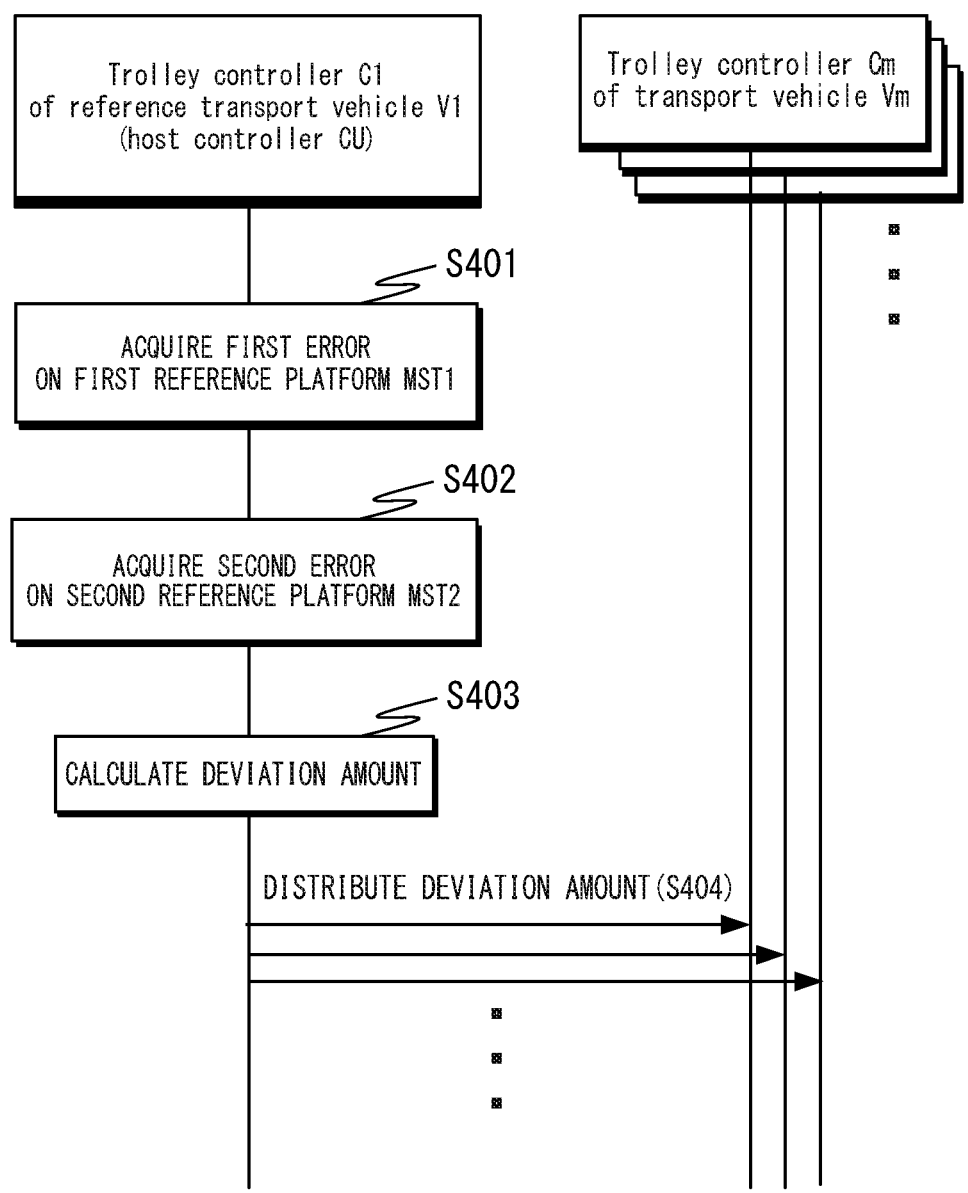
FIG. 11 is a diagram showing another example of the operation sequence of the transport system.

FIG. 11 is a diagram showing an example of an operation sequence when the trolley controller C1 of the reference transport vehicle V1 includes the host controller CU. When the trolley controller C1 includes the host controller CU, the trolley controller C1 has the respective constituents of the host controller CU shown in FIG. 5. The description overlapping with the operation sequence shown in FIG. 8 will be omitted or simplified. First, the teaching unit TU is placed on the first reference platform MST1 by the reference transport vehicle V1 to detect a first error. By this detection, the error acquirer 21C1 of the trolley controller C1 acquires the first error on the first reference platform MST1 (Step S401).

Next, the teaching unit TU is placed on the second reference platform MST2 by the reference transport vehicle V1 to detect a second error. By this detection, the error acquirer 21C1 of the trolley controller C1 acquires the second error on the second reference platform MST2 (Step S402). The first error and the second error acquired by the error acquirer 21C1 are stored in the data storage 25C1. Next, the deviation amount calculator 12CU of the trolley controller C1 (the host controller CU) calculates a deviation amount, which is a difference between the first error and the second error (Step S403). The calculated deviation amount (coordinate value) is stored in the data storage 17CU.

The deviation amount stored in the data storage 17CU is distributed to each of the other transport vehicles V2 to Vm by the deviation amount distributor 13CU of the trolley controller C1 (the host controller CU) (Step S403). Each of the other transport vehicles V2 to Vm can accurately place the article 2 at the transfer destination LP by using the deviation amount distributed from the trolley controller C1 of the reference transport vehicle V1 even when the error is detected on either the first reference platform MST1 and the second reference platform MST2. As described above, even when the trolley controller C1 includes the host controller CU, the amount of time required for teaching the transport vehicle V can be reduced. Since the trolley controller C of the transport vehicle V functions as the host controller CU, cost reduction can be achieved.

The order of executing processes such as operations and steps in the system, the method, the apparatus, the program, and the recording medium in the appended claims, the specification and the drawings can be realized in an arbitrary order unless an output of the previous processing is used in the following processing. Furthermore, while operations in the above example have been described with expressions such as "first", "next", and "subsequently" for the sake of convenience, the operations need not always be implemented in that order. In addition, the contents of Japanese Patent Application No. 2017-020227 and all documents cited in the detailed description of this disclosure are incorporated herein by reference to the extent permitted by law.

The invention claimed is:

1. A transport system comprising:
a track installed across multiple transfer destinations;
a plurality of transport vehicles each including a traveling body that travels on the track, and a transferer provided in the traveling body that holds an article and receives or delivers the article from or to the transfer destination;
a stop indicator mounted at each transfer destination to enable transfer of an article to be performed by the transferer at a predetermined position on the transfer destination, and that indicates a stop position of the traveling body; and
a controller that controls the transport vehicles;
the transferer receiving or delivering an article from or to the transfer destination in a state where the traveling body is stopped on the basis of the stop indicator,
wherein the controller finds a deviation amount, which is a difference between a first error and a second error, on the basis of the first error and the second error,
the first error being an error that occurs when a first traveling body of a first transport vehicle stops on the basis of a first stop indicator at a first transfer destination, between a position at which an article is placed on the first transfer destination by a first transferer and a predetermined position on the first transfer destination, and
the second error being an error that occurs when the first traveling body of the first transport vehicle, which is used to find the first error, stops on the basis of a second stop indicator at a second transfer destination, between a position at which the article is placed on the second transfer destination by the first transferer and a predetermined position on the second transfer destination,
wherein the controller acquires, for at least one transfer destination other than the first transfer destination and the second transfer destination, an nth error that occurs when the first traveling body of the first transport vehicle stops on the basis of an nth stop indicator at an nth transfer destination, where n is an integer and n≥3, between a position at which the article is placed on the nth transfer destination by the first transferer and a predetermined position on the nth transfer destination, and
wherein, regarding an mth transport vehicle, where m is an integer and m≥2, other than the first transport vehicle,
the controller corrects a stop position of an mth traveling body with respect to the nth transfer destination by the nth error and an mth-1 error, for the mth transport vehicle of which the mth-1 error that occurs when the mth traveling body of the mth transport vehicle stops on the basis of the first stop indicator at the first transfer destination, between a position at which the article is placed on the first transfer destination by an mth transferer and a predetermined position, on the first transfer destination, is acquired, and the controller corrects the stop position of the mth traveling body with respect to the nth transfer destination by the nth error and an mth-2 error as well as the deviation amount, for the mth transport vehicle of which the mth-2 error that occurs when the mth traveling body of the mth transport vehicle stops on the basis of the second stop indicator at the second transfer destination, between a position at which the article is placed on the second transfer destination by the mth transferer and a predetermined position on the second transfer destination, is acquired.

2. The transport system according to claim 1, wherein
the first error and the second error are determined as coordinate values in one coordinate system, and
the deviation amount is determined as a coordinate value in the coordinate system.

3. The transport system according to claim 1, wherein the controller statistically processes a plurality of the deviation amounts found by using a plurality of the transport vehicles and uses the obtained value as the deviation amount.

4. A transport method in a transport system that includes:
a track installed across multiple transfer destinations;
a plurality of transport vehicles each including a traveling body that travels on the track, and a transferer provided in the traveling body that holds an article and receives or delivers the article from or to the transfer destination; and
a stop indicator mounted at each transfer destination to enable transfer of an article to be performed by the transferer at a predetermined position on the transfer destination, and that indicates a stop position of the traveling body,
the transferer receiving or delivering an article from or to the transfer destination in a state where the traveling body is stopped on the basis of the stop indicator,
the transport method comprising:
stopping a first traveling body of a first transport vehicle on the basis of a first stop indicator at a first transfer destination and finding a first error that occurs between a position at which an article is placed on the first transfer destination by a first transferer and a predetermined position on the first transfer destination;

stopping the first traveling body of the first transport vehicle used to find the first error, on the basis of a second stop indicator at a second transfer destination, and finding a second error that occurs between a position at which the article is placed on the second transfer destination by the first transferer and a predetermined position on the second transfer destination;
finding a deviation amount, which is a difference between the first error and the second error;
stopping the first traveling body of the first transport vehicle on the basis of an nth stop indicator at an nth transfer destination, where n is an integer and n≥3, and finding an nth error between a position at which the article is placed on the nth transfer destination by the first transferer and a predetermined position on the nth transfer destination, for at least one transfer destination other than the first transfer destination and the second transfer destination; and
regarding an mth transport vehicle, where m is an integer and m≥2, other than the first transport vehicle,
for the mth transport vehicle of which an mth-1 error that occurs between a position at which the article is placed on the first transfer destination by an mth transferer and a predetermined position on the first transfer destination is found by stopping an mth traveling body of the mth transport vehicle on the basis of the first stop indicator at the first transfer destination, correcting a stop position of the mth traveling body with respect to the nth transferer by the nth error and the mth-1 error, and
for the mth transport vehicle of which an mth-2 error that occurs between a position at which the article is placed on the second transfer destination by the mth transferer and a predetermined position on the second transfer destination is found by stopping the mth traveling body of the mth transport vehicle on the basis of the second stop indicator at the second transfer destination, correcting the stop position of the mth traveling body with respect to the nth transfer destination by the nth error and the mth-2 error as well as the deviation amount.

5. The transport system according to claim 2, wherein the controller statistically processes a plurality of the deviation amounts found by using a plurality of the transport vehicles and uses the obtained value as the deviation amount.

* * * * *